(12) United States Patent
Tsai et al.

(10) Patent No.: US 12,724,045 B2
(45) Date of Patent: Sep. 1, 2026

(54) COMPUTING SYSTEM AND COMPUTING METHOD FOR CARBON EMISSION OF ENERGY-CONSUMING DEVICES

(71) Applicant: CHICONY POWER TECHNOLOGY CO., LTD., New Taipei City (TW)

(72) Inventors: Jewel Tsai, New Taipei City (TW); Tse-Wen Chang, New Taipei City (TW)

(73) Assignee: CHICONY POWER TECHNOLOGY CO., LTD., New Taipei City (TW)

( * ) Notice: Subject to any disclaimer, the term of this patent is extended or adjusted under 35 U.S.C. 154(b) by 549 days.

(21) Appl. No.: 18/225,691

(22) Filed: Jul. 25, 2023

(65) Prior Publication Data

US 2024/0353454 A1 Oct. 24, 2024

(30) Foreign Application Priority Data

Apr. 20, 2023 (TW) ................................ 112114834

(51) Int. Cl.
*G01R 21/133* (2006.01)

(52) U.S. Cl.
CPC ................................ *G01R 21/133* (2013.01)

(58) Field of Classification Search
CPC ...... G01R 21/133; G16C 20/00; G16C 20/70; G16C 20/80
See application file for complete search history.

(56) References Cited

U.S. PATENT DOCUMENTS

2012/0185108 A1* 7/2012 Howe ....................... H02J 3/14 700/295
2012/0310861 A1 12/2012 Varma et al.
2015/0089027 A1 3/2015 Zweigle et al.
2019/0004098 A1 1/2019 Wong et al.
(Continued)

FOREIGN PATENT DOCUMENTS

CN 102460335 B 7/2015
CN 114966282 A 8/2022
(Continued)

OTHER PUBLICATIONS

Office Action dated Nov. 28, 2023 of the corresponding Taiwan patent application No. 112114834.

*Primary Examiner* — Tung S Lau
(74) *Attorney, Agent, or Firm* — HDLS IPR SERVICES; Chun-Ming Shih

(57) ABSTRACT

A computing system of energy-consuming devices including multiple energy-consuming devices connected with same meter, a carbon-emission monitor kit connected with the multiple devices, and a platform data process system connected with the carbon-emission monitor kit is disclosed. The carbon-emission monitor kit computes a device energy value (DEV) for each device while the devices operate. The platform data process system computes an estimated device carbon emission (EDCE) for each device and an estimated device carbon emission sum (EDCES) for all devices based on the DEV, a device performance parameter (DPP) of each device, and a carbon-emission factor. Further, the platform data process system finds at least one key carbon-emission source among the multiple devices according to the proportion of each EDCE in the EDCES, and issues an alarm aimed at the key carbon-emission source.

14 Claims, 10 Drawing Sheets

(56) References Cited

U.S. PATENT DOCUMENTS

| | | | |
|---|---|---|---|
| 2022/0092707 | A1 | 3/2022 | Pandharpure et al. |
| 2022/0190641 | A1 | 6/2022 | Decker et al. |
| 2022/0312315 | A1 | 9/2022 | Xu et al. |

FOREIGN PATENT DOCUMENTS

| | | | | | |
|---|---|---|---|---|---|
| CN | 115099594 | A | | 9/2022 | |
| CN | 115222216 | A | | 10/2022 | |
| CN | 118569667 | A | * | 8/2024 | ............. G06Q 50/06 |
| CN | 121584605 | A | * | 2/2026 | .............. H02J 3/008 |
| TW | 201820246 | A | | 6/2018 | |
| TW | 202044182 | A | | 12/2020 | |
| TW | I720652 | B | | 3/2021 | |
| TW | I795296 | B | | 3/2023 | |

* cited by examiner

| | | $DPRP_1$ | $DPRP_2$ | $DPRP_3$ | $DPRP_4$ | $DPRP_0$ | | | |
|---|---|---|---|---|---|---|---|---|---|
| | | 1.0522 | 1.0454 | 1.0563 | 1.0848 | 0.3663 | 7.8% | | 1.7% |
| No | MEV | $DEV_1$ | $DEV_2$ | $DEV_3$ | $DEV_4$ | DEVS | DERD | MEVA | DERDA |
| 1 | 33 | 8 | 10 | 6 | 7 | 31 | 6.5% | 32.80 | 0.6% |
| 2 | 32 | 6 | 8 | 10 | 6 | 30 | 6.7% | 31.75 | 0.8% |
| 3 | 30 | 4 | 6 | 8 | 10 | 28 | 7.1% | 29.78 | 0.7% |
| 4 | 25 | 4 | 3 | 7 | 9 | 23 | 8.7% | 24.50 | 2.0% |
| 5 | 18 | 7 | 9 | 1 | 0 | 17 | 5.9% | 17.83 | 0.9% |
| 6 | 15 | 9 | 1 | 0 | 4 | 14 | 7.1% | 14.85 | 1.0% |
| 7 | 12 | 1 | 0 | 4 | 6 | 11 | 9.1% | 11.79 | 1.8% |
| 8 | 23 | 7 | 4 | 3 | 7 | 21 | 9.5% | 22.31 | 3.1% |
| 9 | 22 | 6 | 7 | 4 | 3 | 20 | 10.0% | 21.11 | 4.2% |
| 10 | 30 | 10 | 6 | 7 | 5 | 28 | 7.1% | 29.61 | 1.3% |

FIG.9

| | | $DPOP_1$ | $DPOP_2$ | $DPOP_3$ | $DPOP_4$ | $DPOP_0$ | | | |
|---|---|---|---|---|---|---|---|---|---|
| | | 1.0069 | 1.0897 | 1.0138 | 1.0627 | 0.8014 | 7.8% | DPOP | 3.5% |
| No | MEV | $DEV_1$ | $DEV_2$ | $DEV_3$ | $DEV_4$ | DEVS | DEOD | MEVA | DEODA |
| 1 | 33 | 8 | 10 | 7 | 6 | 31 | 6.5% | 32.43 | 1.8% |
| 2 | 32 | 6 | 10 | 8 | 6 | 30 | 6.7% | 31.43 | 1.8% |
| 3 | 31 | 5 | 6 | 8 | 10 | 29 | 6.9% | 30.31 | 2.3% |
| 4 | 26 | 5 | 3 | 7 | 9 | 24 | 8.3% | 24.96 | 4.1% |
| 5 | 23 | 7 | 9 | 5 | 0 | 21 | 9.5% | 21.92 | 4.9% |
| 6 | 17 | 9 | 2 | 1 | 4 | 16 | 6.3% | 16.51 | 3.0% |
| 7 | 14 | 1 | 2 | 6 | 4 | 13 | 7.7% | 13.52 | 3.5% |
| 8 | 23 | 7 | 5 | 2 | 7 | 21 | 9.5% | 21.96 | 4.7% |
| 9 | 22 | 3 | 4 | 7 | 6 | 20 | 10.0% | 20.85 | 5.5% |
| 10 | 30 | 10 | 7 | 6 | 5 | 28 | 7.1% | 29.09 | 3.1% |

FIG.10

| DPRP | | | | | | 93% | 94% | 93% | 91% |
|---|---|---|---|---|---|---|---|---|---|
| RMEV | $DPP_1$ | $DPP_2$ | $DPP_3$ | $DPP_4$ | $MEV_{\text{出k}}$ | $DPI_1$ | $DPI_2$ | $DPI_3$ | $DPI_4$ |
| 1.0069 | 1.0594 | 1.0526 | 1.0635 | 1.0923 | 33.0 | 94% | 95% | 94% | 92% |
| 1.0086 | 1.0613 | 1.0545 | 1.0654 | 1.0941 | 32.0 | 94% | 95% | 94% | 91% |
| 1.0055 | 1.0580 | 1.0511 | 1.0620 | 1.0907 | 31.0 | 95% | 95% | 94% | 92% |
| 1.0174 | 1.0706 | 1.0637 | 1.0747 | 1.1037 | 26.0 | 93% | 94% | 93% | 91% |
| 1.0428 | 1.0973 | 1.0902 | 1.1015 | 1.1312 | 23.0 | 91% | 92% | 91% | 88% |
| 1.0026 | 1.0549 | 1.0481 | 1.0590 | 1.0876 | 17.0 | 95% | 95% | 94% | 92% |
| 1.0130 | 1.0659 | 1.0591 | 1.0700 | 1.0989 | 14.0 | 94% | 94% | 93% | 91% |
| 1.0314 | 1.0853 | 1.0783 | 1.0895 | 1.1189 | 23.0 | 92% | 93% | 92% | 89% |
| 1.0357 | 1.0898 | 1.0828 | 1.0940 | 1.1236 | 22.0 | 92% | 92% | 91% | 89% |
| 1.0135 | 1.0664 | 1.0595 | 1.0705 | 1.0994 | 30.0 | 94% | 94% | 93% | 91% |

FIG.11

| DPOP | | | | | | 96% | 89% | 95% | 91% |
|---|---|---|---|---|---|---|---|---|---|
| RMEV | $DPP_1$ | $DPP_2$ | $DPP_3$ | $DPP_4$ | $MEV_{\text{出k}}$ | $DPI_1$ | $DPI_2$ | $DPI_3$ | $DPI_4$ |
| 1.0177 | 1.0248 | 1.1090 | 1.0318 | 1.0815 | 33.0 | 98% | 90% | 97% | 92% |
| 1.0183 | 1.0253 | 1.1096 | 1.0324 | 1.0821 | 32.0 | 98% | 90% | 97% | 92% |
| 1.0228 | 1.0298 | 1.1145 | 1.0369 | 1.0869 | 31.0 | 97% | 90% | 96% | 92% |
| 1.0415 | 1.0487 | 1.1349 | 1.0559 | 1.1068 | 26.0 | 95% | 88% | 95% | 90% |
| 1.0490 | 1.0563 | 1.1431 | 1.0635 | 1.1148 | 23.0 | 95% | 87% | 94% | 90% |
| 1.0299 | 1.0370 | 1.1223 | 1.0441 | 1.0945 | 17.0 | 96% | 89% | 96% | 91% |
| 1.0355 | 1.0427 | 1.1284 | 1.0498 | 1.1004 | 14.0 | 96% | 89% | 95% | 91% |
| 1.0472 | 1.0544 | 1.1411 | 1.0617 | 1.1129 | 23.0 | 95% | 88% | 94% | 90% |
| 1.0550 | 1.0623 | 1.1497 | 1.0696 | 1.1212 | 22.0 | 94% | 87% | 93% | 89% |
| 1.0312 | 1.0383 | 1.1237 | 1.0454 | 1.0958 | 30.0 | 96% | 89% | 96% | 91% |

FIG.12

COMPUTING SYSTEM AND COMPUTING METHOD FOR CARBON EMISSION OF ENERGY-CONSUMING DEVICES

BACKGROUND OF THE INVENTION

1. Technical Field

The present disclosure relates to a computation for carbon-emission, and specifically to a computing system and a computing method for carbon-emission of energy-consuming devices.

2. Description of Related Art

The most common approach of computing carbon emission is to directly transform the values measured by the meters in the building (such as power meters, natural gas meters, and fuel meters, etc.) into carbon emissions.

However, due to the consideration of construction cost or installation restrictions, parts of the fields or buildings may not afford an individual meter for every single energy-consuming device. Under such circumstance, it is hard for the management system to compute the carbon-emission of every single energy-consuming device operating in the environment. Therefore, the management system cannot effectively find the key carbon-emission source that affects the environment the most. Because the key carbon-emission source can neither be found nor be targeted, the management system in the related arts can only provide limited effect for energy-saving and emission-reducing.

Since, the management system of the related arts cannot monitor the carbon emission and the performance trend for every single energy-consuming device, when any of the energy-consuming devices encounters a problem (such as having the performance declining), it cannot be immediately aware. Also, the management system of the related arts cannot immediately inform the user to maintain or replace the energy-consuming device that encounters the problems.

SUMMARY OF THE INVENTION

The present disclosure is directed to a computing system and a computing method for carbon-emission of energy-consuming devices, which may monitor the carbon-emission of each energy-consuming device in the environment to find a key carbon-emission source that affects the environment the most.

In one of the exemplary embodiments, the computing system of the present disclosure includes:

multiple energy-consuming devices connected with same meter, wherein the meter generates a meter energy value (MEV);

a carbon-emission monitor kit connected with the multiple energy-consuming devices and the meter, including:

an edge data process system, configured to collect real-time data of each of the energy-consuming devices while the multiple energy-consuming devices operate and compute an operation data of each of the energy-consuming devices based on specification information and the real-time data of each of the energy-consuming devices, wherein the operation data at least includes a device energy value (DEV); and a carbon-emission management platform connected with the carbon-emission monitor kit, including:

a platform data process system configured to perform a measurement splitting procedure, wherein the measurement splitting procedure includes:

computing an estimated device carbon emission (EDCE) of each of the energy-consuming devices based on the DEV, a device performance parameter (DPP), and a carbon-emission factor of each of the energy-consuming devices;

accumulating the EDCE of all energy-consuming device connected with the meter to generate an estimated device carbon emission sum (EDCES);

computing a percentage of the EDCE in the EDCES for each of the energy-consuming devices to rank the carbon-emission of the multiple energy-consuming devices and find a key carbon-emission source from the multiple energy-consuming devices; and issuing an alarm for the at least one key carbon-emission source.

In one of the exemplary embodiments, the computing method of the present disclosure is incorporated with the computing system mentioned above and includes following steps:

a) controlling the multiple energy-consuming devices to operate, wherein the multiple energy-consuming devices are connected with same meter and the meter generates a meter energy value (MEV);

b) while the multiple energy-consuming devices operate, collecting real-time data of each of the energy-consuming devices and computing an operation data of each of the energy-consuming devices based on a specification information and the real-time data of each of the energy-consuming devices by a carbon-emission monitor kit of the carbon-emission computing system, wherein the operation data at least includes a device energy value (DEV);

c) computing an estimated device carbon emission (EDCE) of each of the energy-consuming devices based on the DEV, a device performance parameter (DPP), and a carbon-emission factor of each of the energy-consuming devices by a carbon-emission analysis subsystem of the carbon-emission computing system;

d) accumulating the EDCE of all of the energy-consuming devices connected with the meter by the carbon-emission analysis subsystem to generate an estimated device carbon emission sum (EDCES);

e) computing a percentage of the EDCE in the EDCES of each of the energy-consuming devices to rank the carbon-emission of the multiple energy-consuming devices by the carbon-emission analysis subsystem, to find at least one key carbon-emission source from the multiple energy-consuming devices; and f) issuing an alarm for the at least one key carbon-emission source by the carbon-emission analysis subsystem.

Comparing with the related arts, even if one single meter is connected with multiple energy-consuming devices at the same time, the present disclosure may respectively compute the carbon-emission of each energy-consuming device, so as to accurately find the key carbon-emission source(s) that affects the environment the most.

Also, the present disclosure may compute the carbon-emission for every energy-consuming device, so the performance trend of each energy-consuming device may be monitored as well, and an alarm may be issued when the performance trend of any energy-consuming device is declining.

BRIEF DESCRIPTION OF THE DRAWINGS

FIG. 9 is a schematic diagram of a reference model of one embodiment according to the present disclosure.

FIG. 10 is a schematic diagram of a dynamic model of one embodiment according to the present disclosure.

FIG. 11 is a schematic diagram of performance reference and performance index of one embodiment according to the present disclosure.

FIG. 12 is a schematic diagram of performance reference and performance index of another embodiment according to the present disclosure.

DETAILED DESCRIPTION OF THE INVENTION

In cooperation with the attached drawings, the technical contents and detailed description of the present invention are described thereinafter according to multiple embodiments, being not used to limit its executing scope. Any equivalent variation and modification made according to appended claims is all covered by the claims claimed by the present invention.

Due to the consideration of construction cost or installation restrictions, parts of the environments cannot arrange an individual meter for every single energy-consuming device (such as a variable frequency fan, a chiller, and an air handling unit of an AC system or a blower, a burner, and a feed water pump of a boiler system). Under these environments, the management system can compute the total carbon-emission of these energy-consuming devices only based on the values measured by the meters in the environments. However, the total carbon-emission can only be corresponding to all energy-consuming devices in the environments instead of corresponding to every single energy-consuming device individually.

The present disclosure provides a novel carbon-emission computing system and computing method, which may improve the resolution of analyzing the carbon-emission, enable to compute the carbon-emission of every single energy-consuming device even if multiple energy-consuming devices are connected to same meter, so that the key carbon-emission source(s) in the environment may be accurately targeted.

Figure 1:
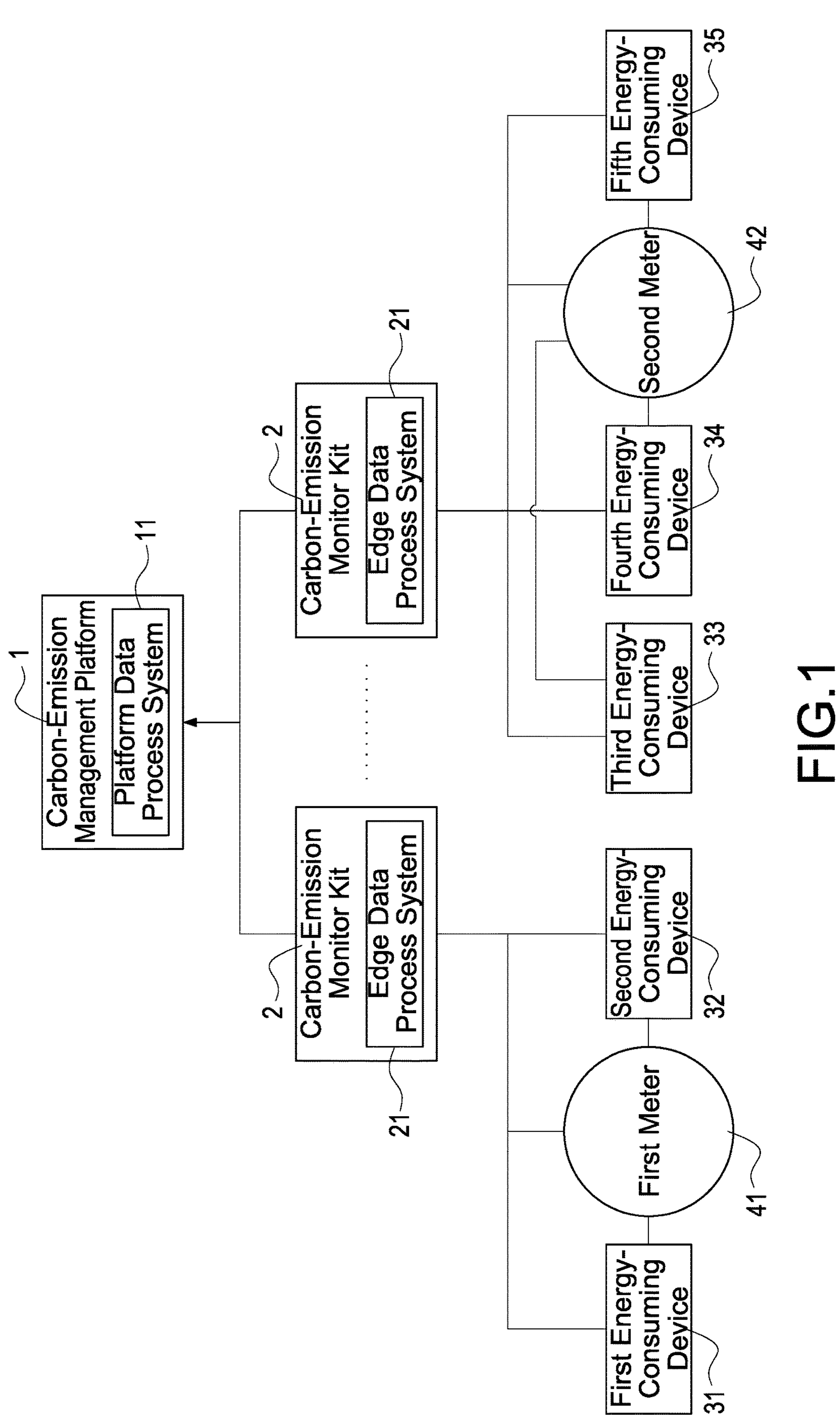
FIG. 1 is a block diagram of a carbon-emission computing system of one embodiment according to the present disclosure.

Please refer to FIG. 1, which is a block diagram of a carbon-emission computing system of one embodiment according to the present disclosure. In one embodiment, the carbon-emission computing system of the present disclosure (referred to as the computing system hereinafter) includes a carbon-emission management platform 1, one or more carbon-emission monitor kits 2, multiple energy-consuming devices 31-35, and one or more meters 41-42.

In the embodiment of FIG. 1, every carbon-emission monitor kit 2 respectively connects with multiple energy-consuming devices and at least one meter, wherein the multiple energy-consuming devices are connected with same meter. In other words, the value measured by the meter represents the total energy-consumption of the multiple energy-consuming devices connected therewith.

As shown in FIG. 1, a first energy-consuming device 31 and a second energy-consuming device 32 are connected with a first meter 41, so the value measured by the first meter 41 represents the total energy-consumption of the first energy-consuming device 41 and the second energy-consuming device 42. A third energy-consuming device 33, a fourth energy-consuming device 34, and a fifth energy-consuming device 35 are connected with a second meter 42, so the value measured by the second meter 42 represents the total energy-consumption of the third energy-consuming device 33, the fourth energy-consuming device 34, and the fifth energy-consuming device 35.

For the sake of understanding, the value measured and generated by each meter after measuring is called a meter energy value (MEV) in the following. It should be mentioned that the meters of different types may generate different MEVs. For example, the MEV of a-power meter will be energy consumption, the MEV of a natural gas meter will be natural gas consumption, and the MEV of a fuel meter will be fuel consumption. The present disclosure transmits the MEV of the meters of different types into carbon-emission to calculate and rank the carbon-emission of multiple energy-consuming devices across different types of meters.

In one embodiment, the computing system of the present disclosure may include more than one carbon-emission monitor kits 2. For the sake of understanding, one carbon-emission monitor kit 2 will be taken as an example in the following for detailed interpretation.

The carbon-emission monitor kit 2 is connected with at least one meter as well as multiple energy-consuming devices connected with the meter in the environment, so as to monitor the meter as well as the multiple energy-consuming devices at the same time.

The carbon-emission monitor kit 2 includes an edge data process system 21. In one embodiment, the carbon-emission monitor kit 2 includes a processor, a central process unit (CPU), a micron control unit (MCU), a programmable logic controller (PLC), or a system on chip (SoC). When performing specific software or firmware, the carbon-emission monitor kit 2 may create and run the edge data process system 21 at the inside of the carbon-emission monitor kit 2. In other words, the edge data process system 21 may be an inner software module of the carbon-emission monitor kit 2.

In one embodiment, the edge data process system 21 is configured and operated to collect real-time data of each energy-consuming device connected therewith while each of the energy-consuming devices operate. The real-time data includes the inverter frequency, the execution time, and the operating mode of each energy-consuming device while operating. On the other hand, the edge data process system 21 obtains specification information of each energy-consuming device and respectively computes operation data of each energy-consuming device based on the specification information and the real-time data of each energy-consuming device. In one embodiment, the operation data of each energy-consuming device at least includes a device energy value (DEV).

It should be mentioned that the specification information may be, for example but not limited to, the energy type, the power consumption, the inverter frequencies of various operation modes, the frequency conversion loss, the fuel consumption, and the energy-consumption computing reference, etc. of the energy-consuming device that is known information while the energy-consuming device is purchased. In the disclosure, the edge data process system 21 may directly read the above known information from the database to compute the DEV of each energy-consuming device in real-time.

The carbon-emission management platform 1 is connected with the carbon-emission monitor kit 21 to receive data uploaded by the carbon-emission monitor kit 21 and perform final process to the received data.

The carbon-emission management platform 1 includes a platform data process system 11. In one embodiment, the carbon-emission management platform 1 has a processor, a central process unit (CPU), a micron control unit (MCU), a programmable logic controller (PLC), or a system on chip (SoC), etc. When performing specific software or firmware, the carbon-emission management platform 1 may create and run the platform data process system 11 at the inside. In other words, the platform data process system 11 is an inner software module of the carbon-emission management platform 1.

In one embodiment, the platform data process system 11 and the edge data process system 21 may execute identical functions. The difference between the platform data process system 11 and the edge data process system 21 is that the edge data process system 21 performs edge computing based on the multiple energy-consuming devices and the meter connected with the edge data process system 21 and the platform data process system 11 performs clouding computing or central computing based on data uploaded from the edge data process system 21. By applying the edge computing technology, the loading of the carbon-emission management platform 1 may be greatly reduced.

For example, if the quantity of the multiple energy-consuming devices in the computing system is small, the carbon-emission monitor kit 21 may directly upload the data of the multiple energy-consuming devices and the meter to the carbon-emission management platform 1, so the platform data process system 11 directly computes the carbon-emission of each energy-consuming device and finds the key carbon-emission source. If the quantity of the multiple energy-consuming devices in the computing system are large, the carbon-emission monitor kit 21 may directly compute the carbon-emission of each energy-consuming device by the edge data process system 21 and then upload the computation result to the carbon-emission management platform 1, so that the platform data process system 11 provides the computation result to the user after final processing. For example, the carbon-emission management platform 1 may find the key carbon-emission source and issue an alarm accordingly for the key carbon-emission source.

For the sake of understanding, in the following embodiments, the platform data process system 11 will be taken as an example to perform a measurement splitting procedure of the present disclosure to compute the carbon-emission of each energy-consuming device. However, the measurement splitting procedure may also be implemented by the edge data process system 21 of the carbon-emission monitor kit 2, the detailed description will be omitted in the following.

In one embodiment, the platform data process system 11 controls all of the energy-consuming devices in the environment to normally operate and obtains the DEV of each energy-consuming device, a device performance parameter (DPP) of each energy-consuming device, and a carbon-emission factor while each energy-consuming device operates, so as to compute an estimated device carbon emission (EDCE) of each energy-consuming device.

In the present disclosure, the DPP of each energy-consuming device indicates a deviation between the value measured by the meter and the value computed based on the real-time data of the energy-consuming device, where the computing approach for the DPP will be discussed below. The carbon-emission factor is a known reference factor published according to time (e.g., years) by the government where the computing system is located, which indicates the corresponding relationship between energy-consumption and carbon-emission (for example, how many kilograms of carbon dioxide is equivalent to one kilowatt-hour of electricity).

As mentioned above, one meter is connected with multiple energy-consuming devices at the same time. In the measurement splitting procedure, the platform data process system 11 accumulates the EDCE of all energy-consuming devices connected with the meter to generate an estimated device carbon emission sum (EDCES). Next, the platform data process system 11 computes a percentage of the EDCE in the EDCES for each energy-consuming device, so as to rank the carbon-emission of the multiple energy-consuming devices connected with the same meter. According to the ranking result, the platform data process system 11 may find one or more key carbon-emission sources from the multiple energy-consuming devices and issue an alarm for the key carbon-emission source(s). For example, the platform data process system 11 may regard the top three or top five energy-consuming devices having the greater carbon-emission as the key carbon-emission sources.

Figure 2:
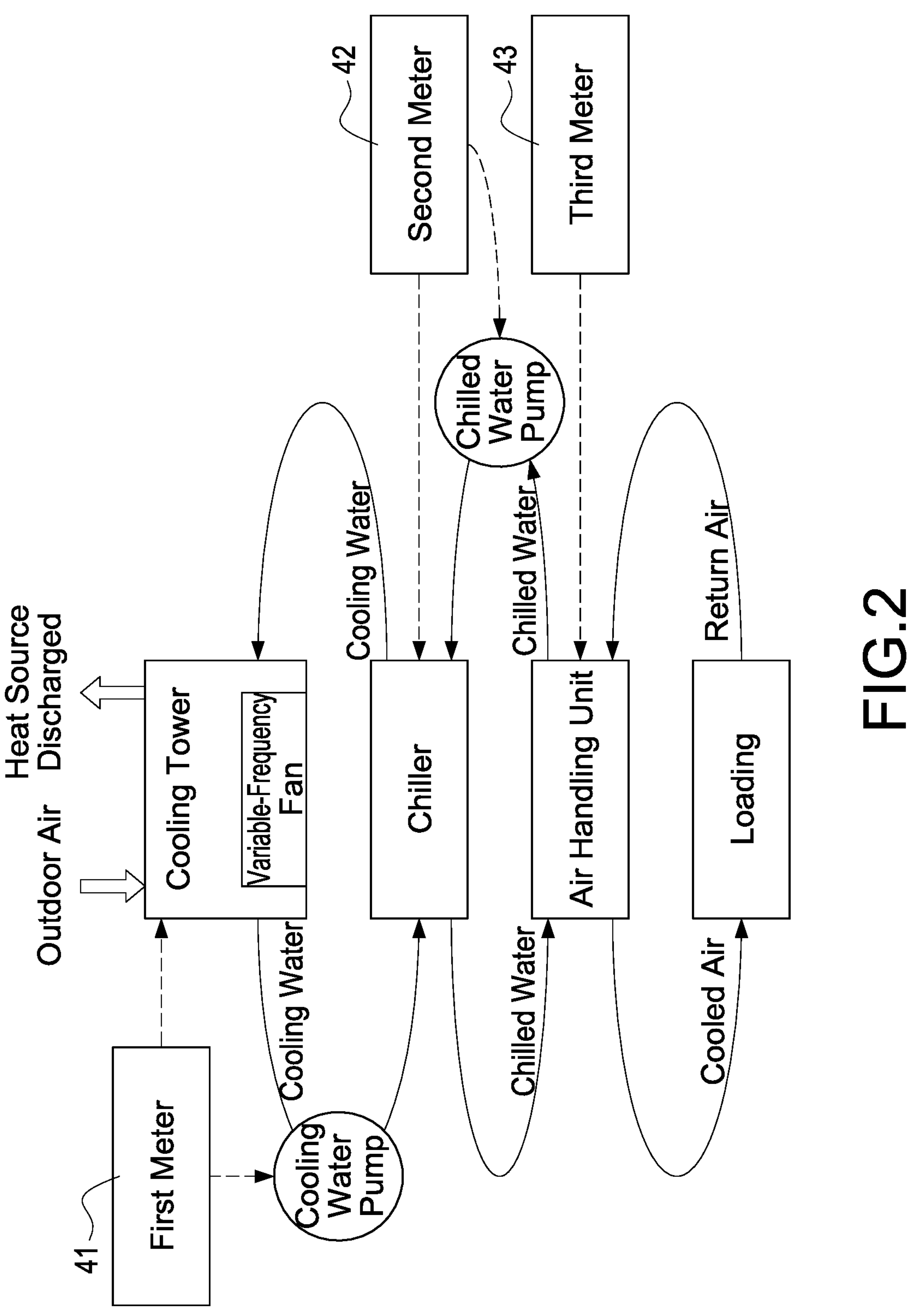
FIG. 2 is a schematic diagram showing the connection of meters of one embodiment according to the present disclosure.

Please refer to FIG. 2, which is a schematic diagram showing the connection of meters of one embodiment according to the present disclosure. As disclosed in FIG. 2, an AC system may include several components such as a cooling tower, a cooling water pump, a chiller, a chilled water pump, and an air handling unit, etc. If each component is equipped with one individual meter to measure its energy consumption, it will increase the construction cost of the AC system.

In the embodiment of FIG. 2, the computing system uses a first meter 41 to monitor the energy consumption of the cooling water pump as well as the variable frequency fan of the cooling tower, uses a second meter 42 to monitor the energy consumption of the chiller and the chilled water pump, and uses a third meter 43 to monitor the energy consumption of the air handling unit. By using the measurement splitting procedure of the present disclosure, the computing system may respectively compute the energy-consumption and the carbon-emission of each component even if the quantity of the meters in the computing system is less than that of the components in the computing system. Therefore, it is helpful for the user to monitor and maintain the carbon-emission sources.

Figure 3:
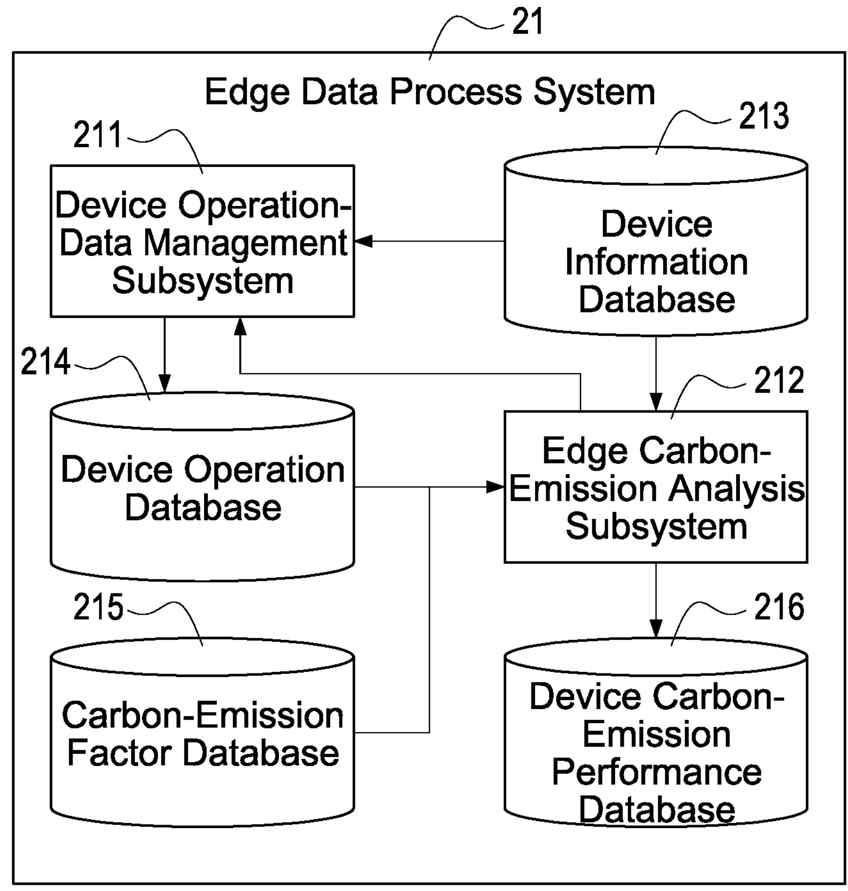
FIG. 3 is a block diagram of an edge data process system of one embodiment according to the present disclosure.
Figure 4:
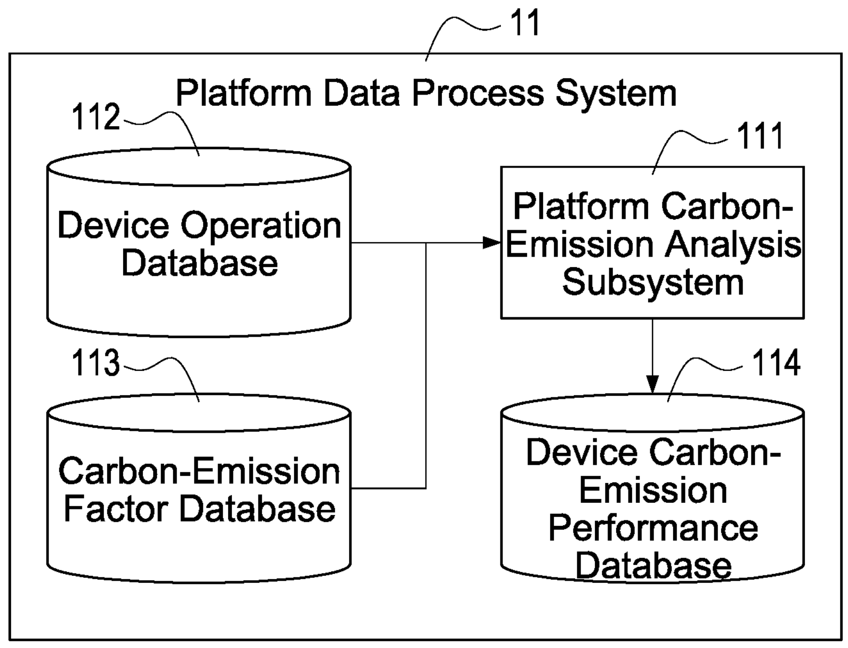
FIG. 4 is a block diagram of a platform data process system of one embodiment according to the present disclosure.

Please refer to FIG. 3 and FIG. 4 at the same time, wherein FIG. 3 is a block diagram of an edge data process system of one embodiment according to the present disclosure and FIG. 4 is a block diagram of a platform data process system of one embodiment according to the present disclosure.

In the embodiment of FIG. 3, the edge data process system 21 includes a device operation-data management subsystem 211, an edge carbon-emission analysis subsystem 212, a device information database 213, a device operation database 214, a carbon-emission factor database 215, and a device carbon-emission performance database 216 which are implemented by software.

The device information database 213 is used to store the specification information of the multiple energy-consuming devices. In one embodiment, the specification information includes at least one of the device names of the energy-consuming device (such as the chiller, the chilled water pump, and the boiler burner, etc.), the energy type (such as electricity or natural gas, etc.), the rated power (KW), the frequency of the inverter (Hz), the frequency conversion loss, and the energy consumption computing reference (such as flow cubed, frequency cubed, or rated power, etc.), but not limited thereto. The specification information is a known information, the manager of the computing system may store the specification information of each of the energy-consuming devices into the device information database 213 based on the product specifications or documents related to the energy-consuming devices after the energy-consuming devices are purchased.

The device operation-data management subsystem 211 is connected with the device information database 213 and is able to read the specification information of each energy-consuming device from the device information database 213. After obtaining the real-time data of each energy-consuming device while the energy-consuming devices operate, the device operation-data management subsystem 211 may respectively compute the operation-data (i.e., the DEV) of each energy-consuming device based on the real-time data and the specification information of each energy-consuming device.

For example, after a variable frequency dimming lamp operates, the device operation-data management subsystem 211 may obtain the real-time data (such as operation frequency and operation time) of the variable frequency dimming lamp, refer the energy consumption computing reference (such as rated power) recorded in the specification information, and then compute the DEV of the variable frequency dimming lamp based on the following formula: rated power×operation frequency×operation time.

For another example, after a variable frequency fan operates, the device operation-data management subsystem 211 may obtain the real-time data (such as operation frequency and operation time) of the variable frequency fan, refer the energy consumption computing reference (such as frequency cubed) recorded in the specification information, and then compute the DEV of the variable frequency fan based on the following formula: rated power×operation frequency$^3$×operation time×(1+frequency conversion loss).

The device operation database 214 is connected with the device operation-data management subsystem 211. The device operation database 214 is used to store the real-time data of the multiple energy-consuming devices, the operation-data computed by the device operation-data management subsystem 211, and the MEV measured and generated by the meter, but not limited thereto.

The carbon-emission factor database 215 is used to store the carbon-emission factors. It should be mentioned that the carbon-emission factors may change based on time or date. For example, carbon-emission factors related to the electricity may be adjusted every year, and the carbon-emission factors related to the natural gas may be changed every three years. In the present disclosure, the computing system stores the carbon-emission factors in accordance with different years. When computing the carbon-emission of the energy-consuming devices within different years, the computing system may apply different carbon-emission factors upon computing. Also, when computing the carbon-emission of the energy-consuming devices of different types, the computing system may apply different carbon-emission factors as well.

The edge carbon-emission analysis subsystem 212 is connected with the device operation-data management subsystem 211, the device information database 213, the device operation database 214, the carbon-emission factor database 215, and the device carbon-emission performance database 216. In the above embodiment, the computing system performs the measurement splitting procedure through the platform data process system 11 of the carbon-emission management platform 1. In another embodiment, the computing system may perform the measurement splitting procedure through the edge data process system 21 of the carbon-emission monitor kit 2. In such embodiment, the edge data process system 21 performs the measurement splitting procedure through the edge carbon-emission analysis subsystem 212 combining with data stored in the device information database 213, the device operation database 214, and the carbon-emission factor database 215. Also, the edge carbon-emission analysis subsystem 212 stores its computing result to the device carbon-emission performance database 216 (detailed described in the following).

In the embodiment of FIG. 4, the platform data process system 11 includes a platform carbon-emission analysis subsystem 111, a device operation database 112, a carbon-emission factor database 113, and a device carbon-emission performance database 114 which are implemented by software.

In one embodiment, the platform data process system 11 only processes the data uploaded from the edge data process system 21 after the edge data process system 21 collected and computed these data. Therefore, it is unnecessary for the platform data process system 11 to be equipped with the device operation-data management subsystem 211 and the device information database 213 as discussed above. In another embodiment, the platform data process system 11 may perform the identical functions as the edge data process system 21, so the platform data process system 11 may still be equipped with the device operation-data management subsystem 211 and the device information database 213 as discussed above (but not shown in FIG. 4).

In one embodiment, the device operation database 112, the carbon-emission factor database 113, and the device carbon-emission performance database 114 of the platform data process system 11 and the device operation database 214, the carbon-emission factor database 215, and the device carbon-emission performance database 216 of the edge data process system 21 are independent from each other. In the embodiment, these databases may synchronize their content. Alternatively, the edge data process system 21 first stores data to the device operation database 214, the carbon-emission factor database 215, and the device carbon-emission performance database 216 and then uploads the data to the platform data process system 11 so that the platform process system 11 may store the data to the device operation database 112, the carbon-emission factor database 113, and the device carbon-emission performance database 114.

In another embodiment, the platform data process system 11 and the edge data process system 21 may share same device operation database, same carbon-emission factor database, and same device carbon-emission performance database.

As mentioned above, the measurement splitting procedure of the present disclosure may be performed either by the edge data process system 21 or by the platform data process system 11. In the embodiment, the platform data process system 11 performs the measurement splitting procedure by the platform carbon-emission analysis subsystem 111 combining with data stored in the device operation database 112 and the carbon-emission factor database 113 as well as data uploaded from the carbon-emission monitor kit 2. Also, the platform carbon-emission analysis subsystem 111 stores the computing result to the device carbon-emission performance database 114.

Figure 5:
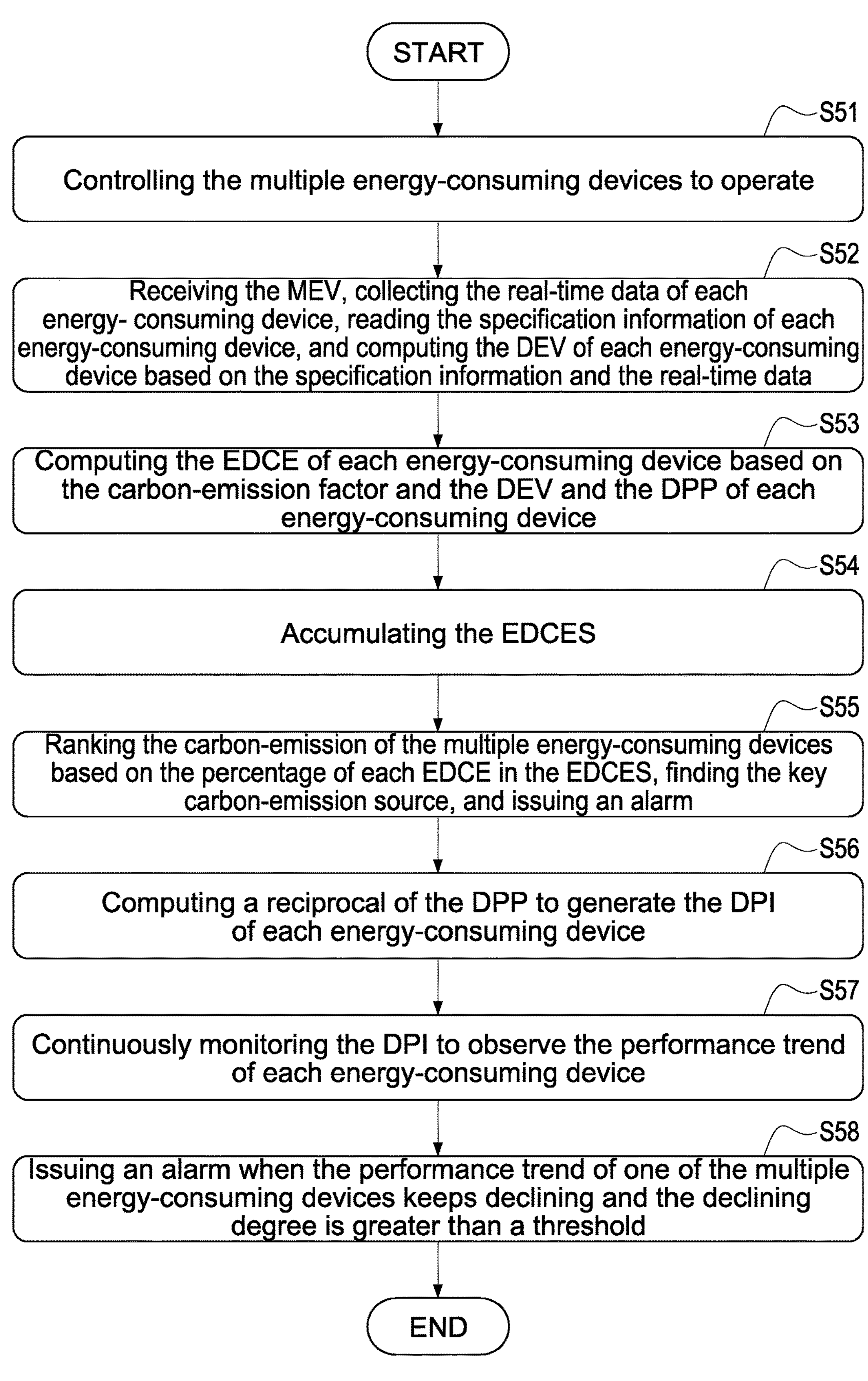
FIG. 5 is a filtering flowchart for key carbon-emission source of one embodiment according to the present disclosure.

Please refer to FIG. 5, which is a filtering flowchart for key carbon-emission source of one embodiment according to the present disclosure. FIG. 5 discloses a carbon-emission computing method of the present disclosure (referred to as the computing method hereinafter), each step of the computing method interprets how the present disclosure uses the measurement splitting procedure to compute the carbon-emission of each of the multiple energy-consuming devices connected with same meter and find the key carbon-emission source that affects the environment the most from the multiple energy-consuming devices.

Each step disclosed in FIG. 5 is applied to the computing system as disclosed in FIG. 1, FIG. 3, and FIG. 4.

To compute the carbon-emission of the multiple energy-consuming devices, the computing system first controls the multiple energy-consuming devices to operate (step S51). More specifically, the computing system may control the multiple energy-consuming devices of different types to operate respectively and use meters of different types to measure these energy-consuming devices that are of different types. For the sake of understanding, in the descriptions below, an example that controls the multiple energy-consuming devices connected with same meter to operate by the computing system is taken to interpret the details.

When the multiple energy-consuming devices operate, the computing system receives the MEV generated by the meter, collects the real-time data of each energy-consuming device, and reads the specification information of each energy-consuming device through the carbon-emission monitor kit 2, and then compute the operation-data of each energy-consuming device based on the specification information and the real-time data of each energy-consuming device, wherein the operation-data at least includes the DEV (step S52).

Next, the computing system computes the EDCE of each energy-consuming device based on the DEV of each energy-consuming device, the carbon-emission factor recorded in the carbon-emission factor database 113 or/and 215, and the DPP of each energy-consuming device (step S53).

The computing approach for the DPP of each energy-consuming device is described below. More specifically, the DEV of each energy-consuming device is an actual value computed based on the actual operation status and the energy consumption computing reference of each energy-consuming device, which should be equal to the MEV that is directly measured by the meter. However, the MEV measured by the meter has the problem of energy-consumption loss, so a difference may exist between the sum of the DEV of each energy-consuming device and the MEV measured by the meter. The present disclosure uses the DPP to compensate the difference to accurately compute the EDCE of each energy-consuming device.

In one embodiment, the computing system computes the EDCE of each energy-consuming device according to the formula (1) below:

$$EDCE_{i,j} = DPP_{i,j} \times DEV_{i,j} \times \text{carbon emission factor} \tag{1}$$

In the above formula (1), i represents the ith energy-consuming device, j represents the jth data.

The present disclosure first computes the DPP of each energy-consuming device and then multiplies the DEV of each energy-consuming device by the DPP and the carbon-emission factor to compute the EDCE, so the computed EDCE may be assured to be closer to an estimated carbon-emission that is computed by multiplying the value of each energy-consuming device measured by the meter (wherein the sum of these values is the MEV) by the carbon-emission factor. In the computing method of the present disclosure, the computing system may compute the DPP of each energy-consuming device in accordance with the MEV measured and generated by the meter after measuring, where the computing approach will be discussed below.

It should be mentioned that, the aforementioned step S53 may be performed either by the platform carbon-emission analysis subsystem 111 of the platform data process system 11 or by the edge carbon-emission analysis subsystem 212 of the edge data process system 21, but not limited thereto.

After the step S53, the computing system accumulates the EDCE of all energy-consuming devices connected with the meter to generate the EDCES (step S54). Also, the computing system ranks the carbon-emission of the multiple energy-consuming devices based on the percentage of the EDCE in the EDCES for each energy-consuming device, so as to find one or more key carbon-emission sources and issue an alarm for the key carbon-emission source(s) (step S55). For example, the computing system may regard the top energy-consuming device among three energy-consuming devices as the key carbon-emission source or regard the top three energy-consuming devices among ten energy-consuming devices as the key carbon-emission sources.

In addition to find the key carbon-emission source based on the EDCE, in another embodiment, the computing system may compute a reciprocal of the DPP of each energy-consuming device to generate a device performance index (DPI) of each energy-consuming device (step S56). In the embodiment, the computing system continuously monitors the DPI of each energy-consuming device to observe the performance trend of each energy-consuming device (step S57). In the present disclosure, a smaller DPI represents a worser operation performance, so an energy-consuming device with a small DPI has the higher probability to be deemed as the key carbon-emission source.

When observing the DPI and finding that the performance trend of one of the multiple energy-consuming devices keeps declining and the declining degree is greater than a threshold, the computing system may issue an alarm for the energy-consuming device having the declining performance trend (step S58).

Please refer to FIG. 11 and FIG. 12, wherein FIG. 11 is a schematic diagram of performance reference and performance index of one embodiment according to the present disclosure, FIG. 12 is a schematic diagram of performance reference and performance index of another embodiment according to the present disclosure.

In FIG. 11, DPRP represents the device performance reference parameter of each energy-consuming device and RMEV represents a ratio of the MEV and a meter energy value adjustment (MEVA) of each energy-consuming device (detailed described in the following). The present disclosure transforms the DPRP into the DPP and the DPI by using the RMEV, so that the computing system or the user may effectively filter the key carbon-emission source and observe the performance trend of each energy-consuming device.

In FIG. 11, $DPP_1$ represents the DPP of a first energy-consuming device 31 of the multiple energy-consuming devices, $DPP_2$ represents the DPP of a second energy-consuming device 32 of the multiple energy-consuming devices, and so on. $DPI_1$ represents the DPI of the first energy-consuming device 31 of the multiple energy-consuming devices, $DPI_2$ represents the DPI of the second energy-consuming device 32 of the multiple energy-consuming devices, and so on.

In FIG. 12, DPOP represents a device performance operation parameter of each energy-consuming device (detailed described in the following). The present disclosure transforms the DPOP into the DPP and the DPI by using the RMEV, so that the computing system or the user may effectively filter the key carbon-emission source and observe the performance trend of each energy-consuming device.

The operation situation and energy loss situation of each energy-consuming device may change along the operation time, the parameters and models pre-established by the computing system before operating cannot be used continuously without any adjustment. In the present disclosure, the computing method generates, by the platform data process system 11 or the edge data process system 21, a reference model including the DPRP of each energy-consuming device under an establishment phase and generates a dynamic model including the DPOP of each energy-consuming device under an adjustment phase. Also, the computing system selects the better one from the reference model and the dynamic model to compute the DPP of each energy-consuming device in accordance with fitness evaluation of the reference model and the dynamic model (detailed described in the following).

In particular, if the reference model is selected, the computing system transforms the DPRP into the DPP and the DPI based on the content or similar embodiment as shown in FIG. 11: if the dynamic model is selected, the computing system transforms the DPOP into the DPP and the DPI based on the content or similar embodiment as shown in FIG. 12 (detailed described in the following). Therefore, no matter what operation situation is currently applied, the computing system may ensure that the carbon-emission being computed is equal to or close to the value directly measured by the meter.

It should be mentioned that the DPP, the DPI, and the EDCE of each energy-consuming device computed through the above steps may be stored in the device carbon-emission performance database 114 or/and 216.

Figure 6:
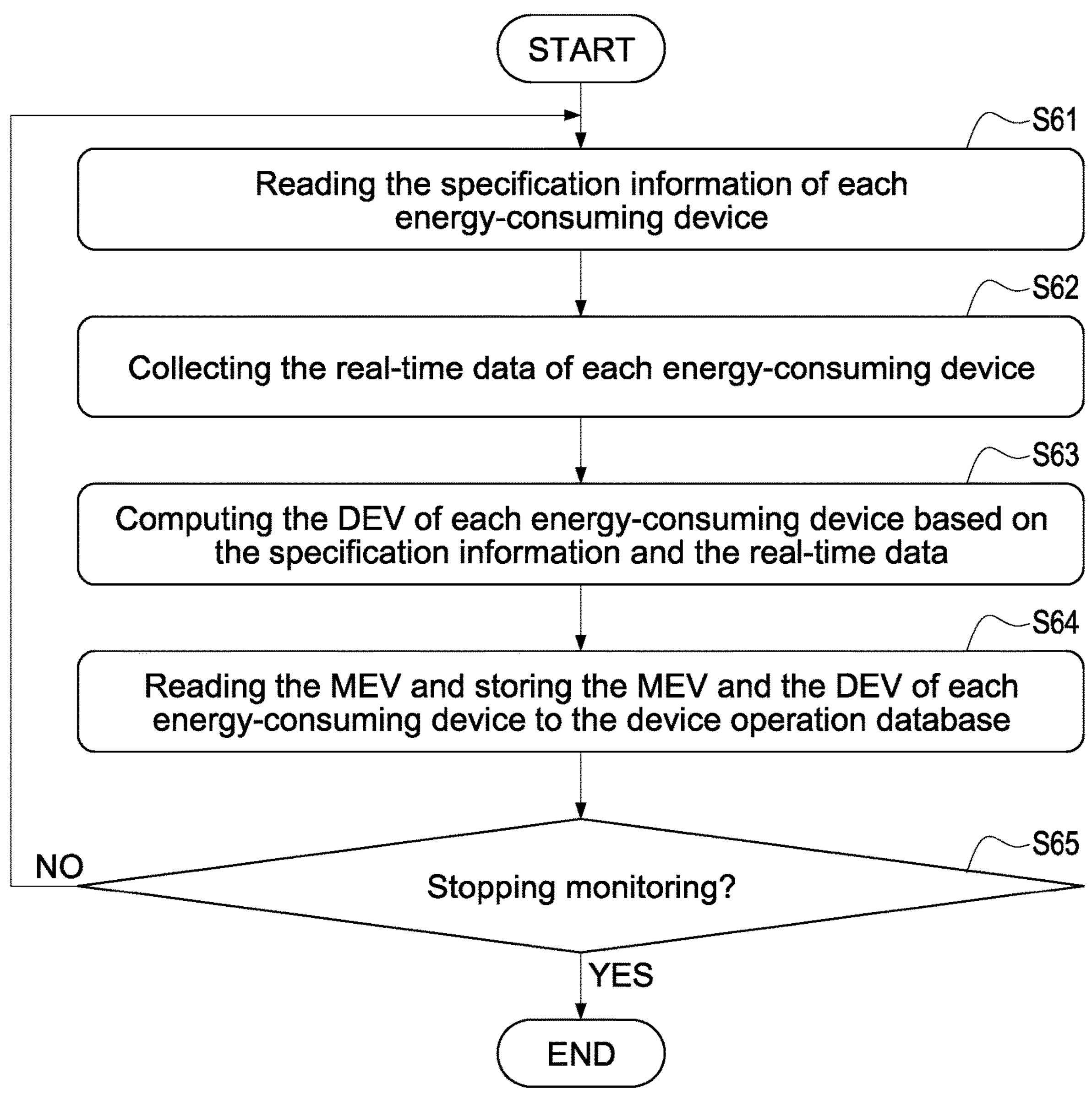
FIG. 6 is a computing flowchart for device operation-data of one embodiment according to the present disclosure.

Please refer to FIG. 6, which is a computing flowchart for device operation-data of one embodiment according to the present disclosure.

To respectively compute the carbon-emission of each energy-consuming device, the computing system must obtain the energy-consumption value directly measured by the meter and also estimate the energy-consumption value actually consumed by each of the energy-consuming devices, and then find a deviation between the two energy-consumption values to compensate the deviation. Therefore, the computing system may estimate the energy-consumption value actually consumed by each energy-consuming device and compensate the aforementioned deviation while each of the energy-consuming devices operates, therefore, a value that is same as or close to the value of each of the energy-consuming devices directly measured by the meter may be obtained.

To achieve the above purpose, the computing system first reads the specification information of each energy-consuming device from the device information database 213 (step S61) and continuously collects real-time data of each energy-consuming device, such as operation frequency and operation time, etc., while each energy-consuming device operations (step S62). Next, the computing system respectively computes the DEV of each energy-consuming device based on the specification information and the real-time data (step S63).

In the meantime, the computing system continuously reads the MEV measured by the meter and stores the MEV and the DEV of each energy-consuming device to the device operation database 112 or/and 214 (step S64). Therefore, the platform data process system 11 and the edge data process system 21 may compute the carbon-emission of each energy-consuming device based on the data stored in the device operation database 112 or/and 214.

In one embodiment, the computing system continuously determines whether to stop monitoring the multiple energy-consuming devices (step S65), and repeatedly performs the step S61 through the step S64 until stopping monitoring.

The above embodiment describes how the computing system monitors, measures, and computes the data of each energy-consuming device. The following embodiment describes how the computing system establishes and adjusts models based on the data and uses the models to obtain the carbon-emission of each energy-consuming device incorporated with the drawings.

Figure 7:
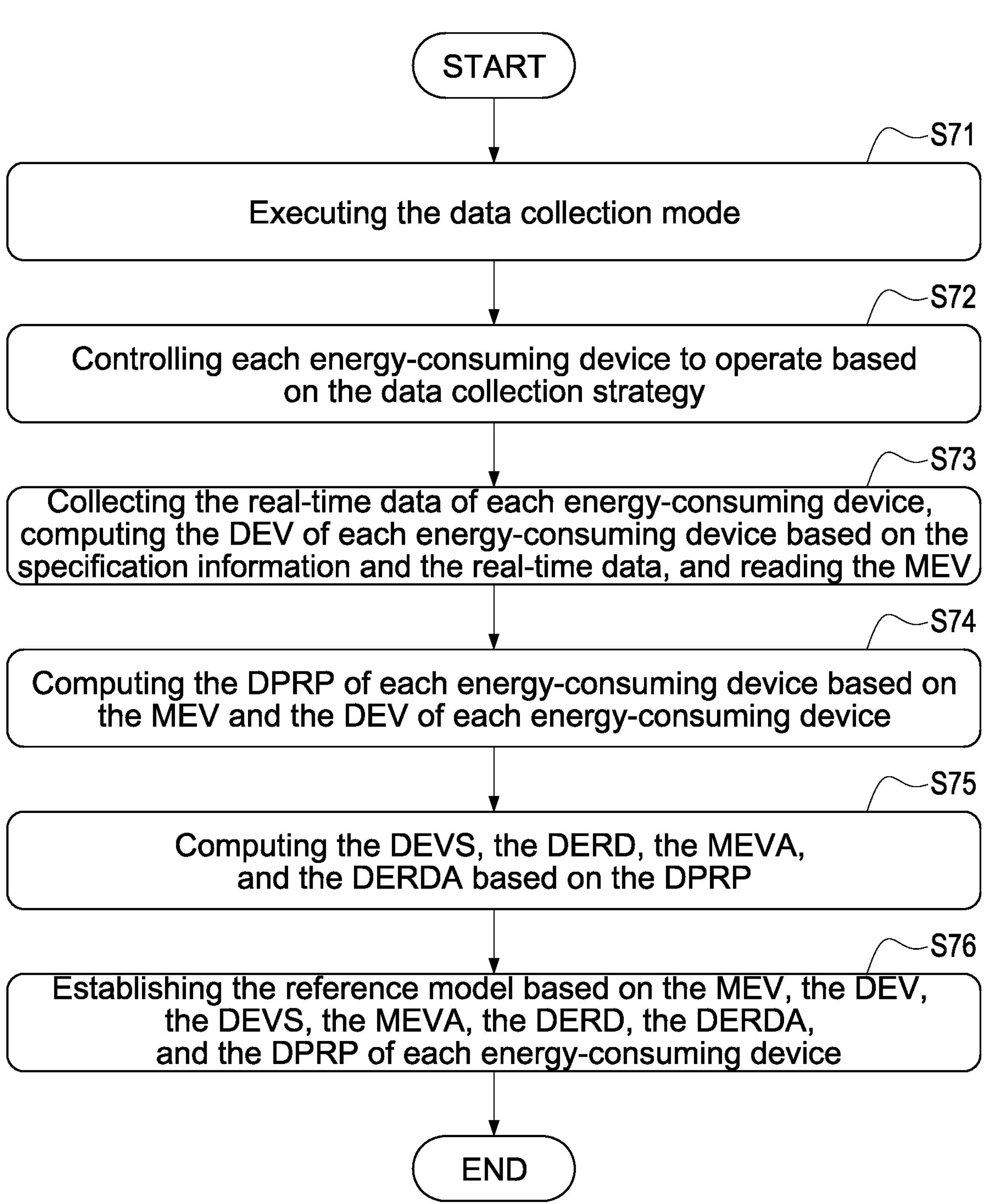
FIG. 7 is a flowchart for model establishment of one embodiment according to the present disclosure.

Please refer to FIG. 7, which is a flowchart for model establishment of one embodiment according to the present disclosure. The computing system of the present disclosure includes a model establishment phase before controlling the energy-consuming devices to normally operate and a model adjustment phase after controlling the energy-consuming devices to normally operate.

The actions the computing system executes under the model establishment phase are described below.

To correctly computes the DEV of each energy-consuming device, the computing system first executes a data collection mode (step S71) and controls each energy-consuming device to respectively operate based on a default data collection strategy in the data collection mode (step S72).

For example, the computing system divides the multiple energy-consuming devices connected with the meter into a group A and a group B, makes the energy-consuming devices (such as devices having four-stage variable frequency) of the group A and the group B operate, adjusts their operation frequency (%) and operation time (min) according to an pre-defined order, and collects real-time data of each of the energy-consuming devices while these energy-consuming devices operate. The data collection strategy may be exampled as table 1 below. The computing system executes the data collection mode for 150 minutes, wherein the computing system collects real-time data every 30 seconds and a total of 300 records of real-time data can be obtained.

TABLE 1

| Execution Order | Variable Frequency of Group A | Variable Frequency of Group B | Execution Time |
|---|---|---|---|
| 1 | 0% | 0% | 5 minutes |
| 2-1 | 100% | 75% | 5 minutes |
| 2-2 | 75% | 50% | 5 minutes |
| 2-3 | 50% | 25% | 5 minutes |
| 2-4 | 25% | 0% | 5 minutes |
| 3 | 0% | 0% | 5 minutes |
| . . . | . . . | . . . | . . . |

The computing system may collect real-time data of each energy-consuming device (i.e., the content according to the data collection strategy), and then the computing system may respectively compute the DEV of each energy-consuming device (such as a first device energy value (FDEV)) based on the specification information and the real-time data since the specification information of each energy-consuming device is known information, and the computing system may read the MEV measured by the meter (step S73).

It should be mentioned that the data collection strategy may be manually set by human or may be a control strategy created by the computing system through machine learning. For example, after controlling the multiple energy-consuming devices to operate for many times by the computing system, a machine learning model (not shown) may learn based on which conditions to simultaneously, respectively, or sequentially control these energy-consuming devices to collect the most effective real-time data.

Next, the computing system computes the DPRP of each energy-consuming device based on the MEV and the DEV of each energy-consuming device (step S74). In one embodiment, the computing system regards the MEV as a response variable and regards the DEV as an independent variable and computes the DPRP of each energy-consuming device through linear regression. In one embodiment, the computing system may compute the DPRP of each energy-consuming device based on the formula (2) below, but not limited thereto:

$$MEV_j = \left(\sum_{i=1}^{N} DPRP_i \times DEV_{i,j}\right) + DPRP_0 \tag{2}$$

Wherein, i represents ith energy-consuming device, j represents jth data, $DPRP_0$ represents a constant of linear regression calculation.

By using the DPRP being computed, the computing system may further compute a device energy value sum (DEVS) of the multiple energy-consuming devices in the model establishment phase (such as a first device energy value sum (FDEVS)), a device energy reference deviation (DERD) between the MEV and the DEVS, a meter energy value adjustment (MEVA) that indicates an adjusted value based on the deviation between an estimated energy-consumption sum of the multiple energy-consuming devices in the model establishment phase and the MEV of the multiple energy-consuming devices in the model establishment phase (such as a first meter energy value adjustment (FMEVA)), and a device energy reference deviation adjustment (DERDA) that indicates the difference between the MEV and the MEVA (step S75).

In one embodiment, the computing system may compute the DEVS of the multiple energy-consuming devices on based the formula (3) below:

$$DEVS_j = \sum_{i=1}^{N} DEV_{i,j} \tag{3}$$

In one embodiment, the computing system may compute the MEVA of the multiple energy-consuming devices based on the formula (4) below:

$$MEVA_j = \left(\sum_{i=1}^{N} DPRP_i \times DEV_{i,j}\right) \tag{4}$$

In one embodiment, the computing system may compute the difference between the MEV and the DEVS to be the DERD of the multiple energy-consuming devices based on the formula (5) below:

$$DERD_j = (MEV_j - DEVS_j) \div DEVS_j \tag{5}$$

In one embodiment, the computing system may compute the difference between the MEV and the MEVA to be the DERDA of the multiple energy-consuming devices based on the formula (6) below:

$$DERDA_j = (MEV_j - MEVA_j) \div MEVA_j \tag{6}$$

Next, the computing system establishes the reference model based on parameters including the MEV and the DEV, the DEVS, the MEVA, the DERD, and the DERDA of each energy-consuming device, and the DPRP of each energy-consuming device (step S76).

Please refer to FIG. 9, which is a schematic diagram of a reference model of one embodiment according to the present disclosure. In the embodiment of FIG. 9, $DEV_1$ represents the DEV of a first energy-consuming device, $DEV_2$ represents the DEV of a second energy-consuming device, $DPRP_1$ represents the DPRP of the first energy-consuming device, and $DPRP_2$ represents the DPRP of the second energy-consuming device, and so on.

As disclosed in FIG. 9, the reference model records multiple data according to an established time, wherein each data includes the MEV currently measured by the meter, the DPRP of each energy-consuming device, the current DEV of each energy-consuming device, and the DEVS, the DERD, the MEVA, and the DERDA of the multiple energy-consuming devices.

It can be seen from the formula (3) and the formula (5) as discussed above, the DEVS and the DERD are computed without compensating the DPRP, so they can represent the direct difference between the value actually measured by the meter and the value computed based on the specification information and real-time data of the energy-consuming device.

It can be seen from the formula (4) and the formula (6), the MEVA and the DERDA are computed with compensating the DPRP of each energy-consuming device. Generally speaking, the difference between the MEVA (and the DERDA) and the MEV is smaller than the difference between the DEVS (and the DERD) and the MEV.

In the embodiment of FIG. 9, after selecting the reference model, the computing system uses the DPRP, the MEV, and the MEVA recorded in the reference model to compute the DPP of each energy-consuming device. It should be mentioned that, if the difference between the MEVA (and the DERDA) and the MEV is greater than the difference between the DEVS (and the DERD) and the MEV, the computing system will compute the DPP of each energy-consuming device based on the DPRP, the MEV, and the DEVS of the reference model after selecting the reference model.

Figure 8:
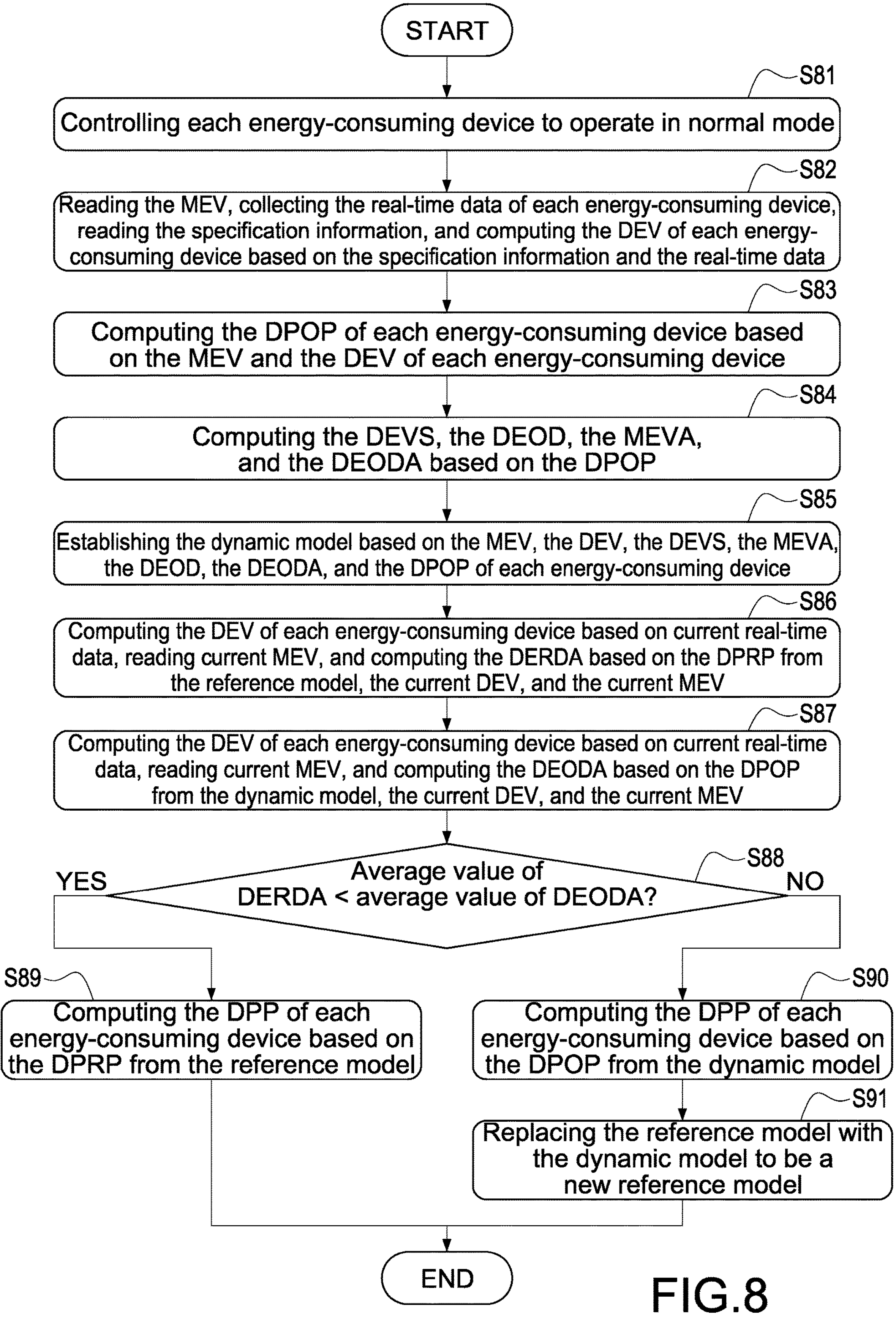
FIG. 8 is a flowchart for model adjustment of one embodiment according to the present disclosure.

Please refer to FIG. 8, which is a flowchart for model adjustment of one embodiment according to the present disclosure. After establishing the reference model, the computing system may control the energy-consuming devices to normally operate and respectively compute the carbon-emission of each energy-consuming device based on the parameters recorded in the reference model. However, as the operation time of each energy-consuming device passes, the computing system of the present disclosure must enter the model adjustment phase to update the reference model.

The actions the computing system executes under the model adjustment phase are described below.

The computing system controls each of the energy-consuming devices to operate in a normal mode (step S81). In the meantime, the computing system reads the specification information of each energy-consuming device, collect real-time data of each energy-consuming device, compute the DEV of each energy-consuming device (such as a second device energy value (SDEV)), and reads the MEV from the meter (step S82).

Next, the computing system computes the DPOP of each energy-consuming device based on the MEV and the DEV of each energy-consuming device (step S83). For example, the computing system may collect real-time data in every 30 seconds after the energy-consuming devices operate and compute the DPOP of each energy-consuming device based on the collected real-time data in every 10 minutes (a total of 20 records of real-time data are collected in 10 minutes).

Similar to the DPRP computed according to the embodiment of FIG. 7, the computing system may regard the MEV as the response variable, regard the DEV as the independent variable, and compute the DPOP of each energy-consuming device through linear regression. In one embodiment, the computing system may compute the DPOP of each energy-consuming device according to the formula (7) below, but not limited thereto:

$$MEV_j = \left(\sum_{i=1}^{N} DPOP_i \times DEV_{i,j}\right) + DPOP_0 \tag{7}$$

Wherein, i represents ith energy-consuming device, j represents jth data, and $DPOP_0$ represent a constant of linear regression calculation.

By using the DPOP being computed, the computing system may further compute the DEVS of the multiple energy-consuming devices (such as a second device energy value sum (SDEVS)) in the model adjustment phase, a device energy operation deviation (DEOD) between the MEV and the DEVS, an MEVA that indicates an adjusted value based on the deviation between an estimated energy-consumption sum of the multiple energy-consuming devices in the model adjustment phase and the MEV (such as a second meter energy value adjustment (SMEVA)), and a device energy operation deviation adjustment (DEODA) that indicates a difference between the MEV and the MEVA (step S84).

In one embodiment, the computing system may compute the DEVS of the multiple energy-consuming devices based on the formula (8) below:

$$DEVS_j = \sum_{i=1}^{N} DEV_{i,j} \tag{8}$$

In one embodiment, the computing system may compute the MEVA of the multiple energy-consuming devices based on the formula (9) below:

$$MEVA_j = \left(\sum_{i=1}^{N} DPOP_i \times DEV_{i,j}\right) \tag{9}$$

In one embodiment, the computing system may compute the difference between the MEV and the DEVS to be the DEOD of the multiple energy-consuming devices based on the formula (10) below:

$$DEOD_j = (MEV_j - DEVS_j) \div DEVS_j \tag{10}$$

In one embodiment, the computing system may compute the difference between the MEV and the MEVA to be the DEODA of the multiple energy-consuming devices based on the formula (11) below:

$$DEROA_j = (MEV_j - MEVA_j) \div MEVA_j \tag{11}$$

Next, the computing system may establish the dynamic model based on the MEV and the DEV, the DEVS, the MEVA, the DEOD, and the DEODA of each energy-consuming device, and the DPOP of each energy-consuming device (step S85).

In particularly, the computing approaches for the DEV, the DEVS, the MEVA, the DEOD, the DEODA, and the DPOP of each energy-consuming device in the model adjustment phase are same as or similar to the computing approaches for the DEV, the DEVS, the MEVA, the DERD, the DERDA, and the DPRP of each energy-consuming device in the model establishment phase as shown in FIG. 7. The difference between the embodiment of FIG. 8 and the embodiment of FIG. 7 is that the computing system, in the embodiment of FIG. 8, computes based on the real-time data of the multiple energy-consuming devices collected while the energy-consuming devices are normally operating.

In one embodiment, the computing system may continuously monitor and observe the DERD and the DEOD. The DERD and the DEOD are used to indicate the difference between the value measured by the meter and the energy-consumption directly computed based on the real-time data of the energy-consuming devices. By monitoring the variation trend of the DERD and the DEOD over time, the computing system may determine whether the performance of each of the energy-consuming devices is declining. When determining that the performance of any energy-consuming device is declining to match a warning condition by monitoring the DERD and/or the DEOD, the computing system may issue an alarm to remind the user of repairing and replacing.

Please refer to FIG. 10, which is a schematic diagram of a dynamic model of one embodiment according to the present disclosure. The embodiment of FIG. 10 is similar to the embodiment of FIG. 9. The difference between the embodiment of FIG. 10 and the embodiment of FIG. 9 is that FIG. 10 shows the content of the dynamic model, wherein the dynamic model records the DPOP of each energy-consuming device and the DEVS, the DEOD, the MEVA, and the DEODA that are computed by the computing system based on the DPOP of each energy-consuming device and the real-time data collected in the model adjustment phase.

In the embodiment of FIG. 10, the difference between the MEVA (and the DEODA) and the MEV is smaller than the difference between the DEVS (and the DEOD) and the MEV. In the embodiment, after selecting the dynamic model, the computing system computes the DPP of each energy-consuming device based on the DPOP, the MEV, and the MEVA of the dynamic model. In another embodiment, if the difference between the MEVA (and the DEODA) and the MEV is greater than the difference between the DEVS (and the DEOD) and the MEV, the computing system will compute the DPP of each energy-consuming device based on the DPOP, the MEV, and the DEVS of the dynamic model.

Refer back to FIG. 8. After the dynamic model is established, the computing system needs to further compare the fitness evaluation of the reference model and the dynamic model, so as to decide whether to select the reference model or the dynamic model to compute the DPP of each energy-consuming device.

As shown in FIG. 8, the computing system obtains the DPRP of each energy-consuming device from the reference model, computes the DEV of each energy-consuming device based on current real-time data, reads the MEV currently measured by the meter, and then computes the DERDA based on the DPRP of each energy-consuming device, the current DEV, and the current MEV (step S86).

Similarly, the computing system obtains the DPOP of each energy-consuming device from the dynamic model, computes the DEV of each energy-consuming device based on current real-time data, reads the MEV currently measured by the meter, and then computes the DEODA based on the DPOP of each energy-consuming device, the current DEV, and the current MEV (step S87). It should be mentioned that the step S86 and the step S87 do not have an essential execution order.

Next, the computing system computes an average value of the DERDA and an average value of the DEODA and determines whether the average value of the DERDA is smaller than the average value of the DEODA (step S88). When determining that the average value of the DERDE is smaller than the average value of the DEODA, it means the performance of the reference model is better than that of the dynamic model. Therefore, in the measurement splitting procedure shown in FIG. 5, the computing system may compute the DPP of each energy-consuming device based on the DPRP of each energy-consuming device recorded in the reference model (step S89).

When determining that the average value of the DERDA is greater than or equal to the average value of the DEODA, it means that the performance of the dynamic model is better than that of the reference model. Therefore, in the measurement splitting procedure shown in FIG. 5, the computing system may compute the DPP of each energy-consuming device based on the DPOP of each energy-consuming device recorded in the dynamic model (step S90).

Because the performance of the reference model is worser than that of the dynamic model, the computing system determines that the reference model is no longer suitable for the current environment. Therefore, the computing system replaces the reference model with the dynamic model to be a new reference model (step S91). By updating the reference model, the present disclosure may adjust the parameters used to compute the carbon-emission in real-time according to the device operation performance while the energy-consuming devices operate, so as to provide information that matches with the actual situation to the manager.

In one embodiment, the computing system may compute the DPP of each energy-consuming device based on the formula (12) below:

$$DPP_{i,j} = \begin{cases} RMEV_j \times DPRP_i, & \text{Average}(DREDA_j) < \text{Average}(DEODA_j) \\ RMEV_j \times DPOP_i, & \text{Average}(DREDA_j) \geq \text{Average}(DEODA_j) \end{cases} \quad (12)$$

In the above formula (12), i represents ith energy-consuming device, j represents jth data, Average ($DREDA_j$) represents the average value of the DREDA, Average ($DEODA_j$) represents the average value of the DEODA, RMEV represents the ratio of the MEV and the MEVA (i.e., $RMEV_j = MEV_j \div MEVA_j$).

As mentioned above, when the average value of the DREDA is smaller than the average value of the DEODA (i.e., the performance of the reference model is better), the computing system applies the DPRP recorded in the reference model to compute the DPP of each energy-consuming device. In this scenario, the computing system computes the MEVA by using the DPRP based on the above formula (4), computes the RMEV by using this MEVA, and then computes the DPP of each energy-consuming device by using the RMEV and the DPRP based on the above formula (12).

When the average value of the DREDA is greater than or equal to the average value of the DEODA (i.e., the performance of the dynamic model is better), the computing system applies the DPOP recorded in the dynamic model to compute the DPP of each energy-consuming device. In this scenario, the computing system computes the MEVA by using the DPOP based on the above formula (9), computes the RMEV by using this MEVA, and then computes the DPP of each energy-consuming device by using the RMEV and the DPOP based on the above formula (12).

In the present disclosure, the computing system automatically selects one of the models having a better performance and applies either the DPRP or the DPOP from the selected model to compute the DPP of each energy-consuming device. Therefore, by using the formula (13) below, the computing system may compute the MEV that is equal to or extremely close to the value directly measured by the meter:

$$MEV_j = \sum_{i=1}^{N} DPP_{i,j} \times DEV_{i,j} \quad (13)$$

By using the computing system and computing method of the present disclosure, even if the multiple energy-consuming devices in the environment are connected with same meter, the present disclosure may raise the analysis resolution to every single energy-consuming device, so as to precisely compute the carbon-emission of every energy-consuming device and effectively filter the key carbon-emission source(s).

As the skilled person will appreciate, various changes and modifications can be made to the described embodiment. It is intended to include all such variations, modifications and equivalents which fall within the scope of the present invention, as defined in the accompanying claims.

What is claimed is:

1. A computing system for carbon-emission of energy-consuming devices, comprising:

multiple energy-consuming devices connected with same meter, wherein the meter generates a meter energy value (MEV);

a carbon-emission monitor kit connected with the multiple energy-consuming devices and the meter, comprising:

an edge data process system, configured to collect real-time data of each of the energy-consuming devices while the multiple energy-consuming devices operate and compute an operation data of each of the energy-consuming devices based on specification information and the real-time data of each of the energy-consuming devices, wherein the operation data at least comprises a device energy value (DEV); and a carbon-emission management platform connected with the carbon-emission monitor kit, comprising:

a platform data process system, configured to perform a measurement splitting procedure, wherein the measurement splitting procedure comprises:

obtaining a reference model generated in an establishing phase before controlling the energy-consuming devices to normally operate and a dynamic model generated in an adjustment phase after controlling the energy-consuming devices to normally operate;

comparing a performance of the reference model and a performance of the dynamic model based on a difference between an estimated energy consumption sum of the multiple energy-consuming devices in the establishing phase and the MEV, and a difference between estimated energy consumption sum of the multiple energy-consuming devices in the adjustment phase and the MEV;

selecting one of the reference model and the dynamic model with better performance to compute a device performance parameter (DPP) of each of the multiple energy-consuming devices;

computing an estimated device carbon emission (EDCE) of each of the energy-consuming devices based on the DEV of each of the energy-consuming devices, the DPP of each of the energy-consuming devices, and a carbon-emission factor;

accumulating the EDCE of all of the energy-consuming devices connected with the meter to generate an estimated device carbon emission sum (EDCES);

computing a percentage of the EDCE in the EDCES for each of the energy-consuming devices to rank the carbon-emission of the multiple energy-consuming devices and find at least one key carbon-emission source from the multiple energy-consuming devices; and issuing an alarm for the at least one key carbon-emission source.

2. The computing system in claim 1, wherein the measurement splitting procedure further comprises:

computing a reciprocal of the DPP of each of the energy-consuming devices to generate a device performance index (DPI) of each of the energy-consuming devices;

continuously monitoring the DPI of the multiple energy-consuming devices and determining a performance trend of each of the energy-consuming devices based on the DPI; and determining that the performance trend of one of the multiple energy-consuming devices is declining and a declining degree is greater than a threshold and issuing the alarm for the energy-consuming device having the performance trend declining.

3. The computing system in claim 2, wherein the carbon-emission monitor kit further comprises:

a device information database, storing the specification information of the multiple energy-consuming devices;

a device operation data management subsystem connected with the device information database, configured to compute the operation data of each of the energy-consuming devices; and a device operation database connected with the device operation data management subsystem, storing the real-time data of the multiple energy-consuming devices, the operation data of the multiple energy-consuming devices, and the MEV.

4. The computing system in claim 3, wherein the specification information at least comprises one of a device name, an energy type, a rated power, an inverter frequency, a frequency conversion loss, and an energy-consumption computing reference of each of the energy-consuming devices.

5. The computing system in claim 3, wherein the platform data process system comprises:

a carbon-emission factor database, storing the carbon-emission factor;

a platform carbon-emission analysis subsystem connected with the carbon-emission factor database and the device operation database, configured to perform the measurement splitting procedure; and a device carbon-emission performance database connected with the platform carbon-emission analysis subsystem, storing the DPP and the EDCE of the multiple energy-consuming devices.

6. The computing system in claim 3, wherein the platform data process system is configured to execute actions below to generate the reference model in the establishment phase:

executing a data collection mode to control each of the energy-consuming devices to respectively operate according to a data collection strategy;

computing a first device energy value (FDEV) of each of the energy-consuming devices based on the specification information and the real-time data while each of the energy-consuming devices operate, and reading the MEV from the meter;

computing a device performance reference parameter (DPRP) of each of the energy-consuming devices based on the MEV and the FDEV of each of the energy-consuming devices;

computing a first device energy value sum (FDEVS) of the multiple energy-consuming devices and computing a device energy reference deviation (DERD) between the MEV and the FDEVS;

computing a first meter energy value adjustment (FMEVA) based on the DPRP of each of the energy-consuming devices, wherein the FMEVA indicates an adjusted value based on a deviation between an estimated energy consumption sum of the multiple energy-consuming devices in the establishment phase and the MEV; and establishing the reference model based on the MEV, the FDEVS, the FMEVA, and the DPRP of each of the energy-consuming devices.

7. The computing system in claim 6, wherein the platform data process system is configured to execute actions below to generate the dynamic model in the adjustment phase, wherein the adjustment phase is performed after the establishment phase:

controlling the multiple energy-consuming devices to normally operate, computing a second device energy value (SDEV) of each of the energy-consuming devices based on the specification information and the real-time data while each of the energy-consuming devices operate, and reading the MEV from the meter;

computing a device performance operation parameter (DPOP) of each of the energy-consuming devices based on the MEV and the SDEV of each of the energy-consuming devices;

computing a second device energy value sum (SDEVS) of the multiple energy-consuming devices and computing a device energy operation deviation (DEOD) between the MEV and the SDEVS;

computing a second meter energy value adjustment (SMEVA) based on the DPOP of each of the energy-consuming devices, wherein the SMEVA indicates an adjusted value based on a deviation between an estimated energy consumption sum of the multiple energy-consuming devices in the adjustment phase and the MEV; and establishing the dynamic model based on the MEV, the SDEVS, the SMEVA, and the DPOP of each of the energy-consuming devices.

8. The computing system in claim 7, wherein the platform data process system is configured to execute actions below to select one of the reference model and the dynamic model in the measurement splitting procedure to compute the DPP of each of the energy-consuming devices:

determining that the performance of the reference model is better than the performance of the dynamic model and computing the DPP of each of the energy-consuming devices based on the DPRP of each of the energy-consuming devices recorded in the reference model; and determining that the performance of the dynamic model is better than the performance of the reference model, computing the DPP of each of the energy-consuming devices based on the DPOP of each of the energy-consuming devices recorded in the dynamic model, and replacing the reference model with the dynamic model to be a new reference model.

9. The computing system in claim 8, wherein the platform data process system is configured to execute actions below to determine the performance of the reference model and the performance of the dynamic model:

obtaining the DPRP of each of the energy-consuming devices from the reference model and computing a device energy reference deviation adjustment (DERDA) according to the DPRP, the FDEV in real-time, and the MEV in real-time, wherein the DERDA indicates a difference between the MEV and the FMEVA;

obtaining the DPOP of each of the energy-consuming devices from the dynamic model and computing a device energy operation deviation adjustment (DEODA) according to the DPOP, the SDEV in real-time, and the MEV in real-time, wherein the DEODA indicates a difference between the MEV and the SMEVA;

computing an average value of the DERDA and another average value of the DEODA; and determining that the performance of the reference model is better than the performance of the dynamic model when the average value of the DERDA is smaller than the average value of the DEODA and determining that the performance of the dynamic model is better than the performance of the reference model when the average value of the DERDA is greater than or equal to the average value of the DEODA.

10. A computing method for carbon-emission of energy-consuming devices, incorporated with a carbon-emission computing system, comprising:

a) controlling the multiple energy-consuming devices to operate, wherein the multiple energy-consuming devices are connected with same meter and the meter generates a meter energy value (MEV);

b) while the multiple energy-consuming devices operate, collecting real-time data of each of the energy-consuming devices and computing an operation data of each of the energy-consuming devices based on a specification information and the real-time data of each of the energy-consuming devices by a carbon-emission monitor kit of the carbon-emission computing system, wherein the operation data at least comprises a device energy value (DEV);

c) computing an estimated device carbon emission (EDCE) of each of the energy-consuming devices based on the DEV of each of the energy-consuming devices, a device performance parameter (DPP) of each of the energy-consuming devices, and a carbon-emission factor by a carbon-emission analysis subsystem of the carbon-emission computing system;

d) accumulating the EDCE of all of the energy-consuming devices connected with the meter by the carbon-emission analysis subsystem to generate an estimated device carbon emission sum (EDCES);

e) computing a percentage of the EDCE in the EDCES for each of the energy-consuming devices to rank the carbon-emission of the multiple energy-consuming devices by the carbon-emission analysis subsystem and finding at least one key carbon-emission source from the multiple energy-consuming devices; and f) issuing an alarm for the at least one key carbon-emission source by the carbon-emission analysis subsystem, wherein the method further comprises following steps before the step c):

a01) generating a reference model in an establishing phase before controlling the energy-consuming devices to normally operate;

a02) generating a dynamic model in an adjustment phase, wherein the adjustment phase is after the establishing phase wherein the adjustment phase is after controlling the energy-consuming devices to normally operate;

a03) comparing a performance of the reference model and a performance of the dynamic model based on a difference between an estimated energy consumption sum of the multiple energy-consuming devices in the establishing phase and the MEV, and a difference between estimated energy consumption sum of the multiple energy-consuming devices in the adjustment phase and the MEV, and selecting one of the reference model and the dynamic model with better performance to compute the DPP of each of the multiple energy-consuming devices.

11. The computing method in claim 10, further comprising:

g) computing a reciprocal of the DPP of each of the energy-consuming devices to generate a device performance index (DPI) of each of the energy-consuming devices;

h) continuously monitoring the DPI of the multiple energy-consuming devices and determining a performance trend of each of the energy-consuming devices based on the DPI; and i) determining that the performance trend of one of the multiple energy-consuming devices is declining and a declining degree is greater than a threshold and issuing the alarm for the energy-consuming device having the performance trend declining.

12. The computing method in claim 11, wherein the step a01) comprises:

a011) executing a data collection mode to control each of the energy-consuming devices to respectively operate according to a data collection strategy;

a012) computing a first device energy value (FDEV) of each of the energy-consuming devices based on the specification information and the real-time data while each of the energy-consuming devices operate and reading the MEV from the meter;

a013) computing a device performance reference parameter (DPRP) of each of the energy-consuming devices based on the MEV and the FDEV of each of the energy-consuming devices;

a014) computing a first device energy value sum (FDEVS) of the multiple energy-consuming devices and computing a device energy reference deviation (DERD) between the MEV and the FDEVS;

a015) computing a first meter energy value adjustment (FMEVA) based on the DPRP of each of the energy-consuming devices, wherein the FMEVA indicates an adjusted value based on a deviation between an estimated energy consumption sum of the multiple energy-consuming devices in the establishment phase and the MEV; and a016) establishing the reference model based on the MEV, the FDEVS, the FMEVA, and the DPRP of each of the energy-consuming devices.

13. The computing method in claim 12, wherein the step a02) comprises:

a021) controlling the multiple energy-consuming devices to normally operate, computing a second device energy value (SDEV) of each of the energy-consuming devices based on the specification information and the real-time data while each of the energy-consuming devices operate, and reading the MEV from the meter;

a022) computing a device performance operation parameter (DPOP) of each of the energy-consuming devices based on the MEV and the SDEV of each of the energy-consuming devices;

a023) computing a second device energy value sum (SDEVS) of the multiple energy-consuming devices and computing a device energy operation deviation (DEOD) between the MEV and the SDEVS;

a024) computing a second meter energy value adjustment (SMEVA) according to the DPOP of each of the energy-consuming devices, wherein the SMEVA indicates an adjusted value based on a deviation between an estimated energy consumption sum of the multiple energy-consuming devices in the adjustment phase and the MEV; and a025) establishing the dynamic model based on the MEV, the SDEVS, the SMEVA, and the DPOP of the each of the energy-consuming devices.

14. The computing method in claim 13, wherein the step a03) comprises:

a031) obtaining the DPRP of each of the energy-consuming devices from the reference model and computing a device energy reference deviation adjustment (DERDA) based on the DPRP, the FDEV in real-time, and the MEV in real-time, wherein the DERDA indicates a difference between the MEV and the FMEVA;

a032) obtaining the DPOP of each of the energy-consuming devices from the dynamic model and computing a device energy operation deviation adjustment (DEODA) based on the DPOP, the SDEV in real-time, and the MEV in real-time, wherein the DEODA indicates a difference between the MEV and the SMEVA;

a033) computing an average value of the DERDA and another average value of the DEODA;

a034) determining that the average value of the DERDA is smaller than the average value of the DEODA and computing the DPP of each of the energy-consuming devices based on the DPRP of each of the energy-consuming devices recorded in the reference model; and a035) determining that the average value of the DERDA is greater than or equal to the average value of the DEODA, computing the DPP of each of the energy-consuming devices based on the DPOP of each of the energy-consuming devices recorded in the dynamic model, and replacing the reference model with the dynamic model to be a new reference model.

* * * * *